(12) United States Patent
Tapily et al.

(10) Patent No.: US 10,453,749 B2
(45) Date of Patent: Oct. 22, 2019

(54) METHOD OF FORMING A SELF-ALIGNED CONTACT USING SELECTIVE SIO$_2$ DEPOSITION

(71) Applicant: Tokyo Electron Limited, Minato-ku, Tokyo (JP)

(72) Inventors: Kandabara N. Tapily, Mechanicville, NY (US); Sangcheol Han, Clifton Park, NY (US); Soo Doo Chae, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/895,736

(22) Filed: Feb. 13, 2018

(65) Prior Publication Data

US 2018/0233407 A1    Aug. 16, 2018

Related U.S. Application Data (60) Provisional application No. 62/458,858, filed on Feb. 14, 2017.

(51) Int. Cl.
*H01L 21/00* (2006.01)
*H01L 21/768* (2006.01)
(Continued)

(52) U.S. Cl.
CPC .. *H01L 21/76897* (2013.01); *H01L 21/02164* (2013.01); *H01L 21/02216* (2013.01);
(Continued)

(58) Field of Classification Search
CPC ......... H01L 21/76897; H01L 21/02304; H01L 21/28562; H01L 21/7687; H01L 21/3105;
(Continued)

(56) References Cited

U.S. PATENT DOCUMENTS

| 6,867,152 B1 | 3/2005 | Hausmann et al. |
| 7,271,112 B1 * | 9/2007 | Papasouliotis ........ C23C 16/045 |
| | | 257/E21.279 |

(Continued)

OTHER PUBLICATIONS

B.B. Burton et al. "Rapid SiO2 Atomic Layer Deposition Using Tris(tert-pentoxy)silanol", Chem Mater. 2008, 20, 7031-7043.

*Primary Examiner* — Nikolay K Yushin (57) ABSTRACT

A substrate processing method for forming a self-aligned contact using selective SiO$_2$ deposition is described in various embodiments. The method includes providing a planarized substrate containing a dielectric layer surface and a metal-containing surface, coating the dielectric layer surface with a metal-containing catalyst layer, and exposing the planarized substrate to a process gas containing a silanol gas for a time period that selectively deposits a SiO$_2$ layer on the metal-containing catalyst layer on the dielectric layer surface. According to one embodiment, the method further includes depositing an etch stop layer on the SiO$_2$ layer and on the metal-containing surfaces, depositing an interlayer dielectric layer on the planarized substrate, etching a recessed feature in the interlayer dielectric layer and stopping on the etch stop layer above the metal-containing surface, and filling the recessed feature with a metal.

19 Claims, 7 Drawing Sheets

(51) Int. Cl.
  *H01L 21/02*      (2006.01)
  *H01L 21/285*     (2006.01)
  *H01L 21/3105*    (2006.01)
  *H01L 23/522*     (2006.01)
  *H01L 23/532*     (2006.01)

(52) U.S. Cl.
  CPC .. *H01L 21/02263* (2013.01); *H01L 21/02304* (2013.01); *H01L 21/02312* (2013.01); *H01L 21/28562* (2013.01); *H01L 21/3105* (2013.01); *H01L 21/76801* (2013.01); *H01L 21/76832* (2013.01); *H01L 21/76879* (2013.01); *H01L 23/5226* (2013.01); *H01L 23/53295* (2013.01)

(58) Field of Classification Search
  CPC ......... H01L 21/02216; H01L 21/02263; H01L 21/02312; H01L 21/02164; H01L 21/76879; H01L 21/76832; H01L 21/76801; H01L 23/5226; H01L 23/53295; H01L 23/53238; H01L 23/49832
  See application file for complete search history.

(56) References Cited

U.S. PATENT DOCUMENTS

| | | | |
|---|---|---|---|
| 7,294,593 | B2 | 11/2007 | Rulkens et al. |
| 7,569,475 | B2 * | 8/2009 | Yang ................. H01L 21/76847 438/618 |
| 7,625,820 | B1 | 12/2009 | Papasouliotis et al. |
| 8,158,488 | B2 | 4/2012 | Hill et al. |
| 10,049,913 | B2 | 8/2018 | Tapily |
| 2017/0092533 | A1 | 3/2017 | Chakraborty et al. |

* cited by examiner

ND OF A SELF-ALIGNED
CONTACT USING SELECTIVE SIO₂
DEPOSITION

METHOD OF FORMING A SELF-ALIGNED CONTACT USING SELECTIVE SiO$_2$ DEPOSITION

CROSS-REFERENCE TO RELATED APPLICATIONS

This application is related to and claims priority to U.S. Provisional Patent Application Ser. No. 62/458,858 filed on Feb. 14, 2017, the entire contents of which are herein incorporated by reference.

FIELD OF THE INVENTION

This invention relates to methods for processing a substrate, and more particularly to methods for forming a self-aligned contact using selective SiO$_2$ deposition.

BACKGROUND OF THE INVENTION

Metal-oxide-semiconductor (MOS) transistors, such as MOS field effect transistors (MOSFET), are commonly used in the manufacture of integrated circuits. MOS transistors include several components, such as a gate electrode, gate dielectric layer, spacers, and source and drain diffusion regions. An interlayer dielectric (ILD) is typically formed over the MOS transistor and covers the diffusion regions.

Electrical connections are made to the MOS transistor by way of contact plugs that are typically formed of a metal such as tungsten. The contact plugs may be fabricated by first patterning the ILD layer to form vias down to the diffusion regions. The patterning process is generally a photolithography process. Next, a metal is deposited in the vias to form the contact plugs. A separate contact plug is formed down to the gate electrode using the same or a similar process.

One problem that can occur during the fabrication of a contact plug is the formation of a contact-to-gate short. A contact-to-gate short is a short circuit that occurs when the contact plug is misaligned and comes into electrical contact with the gate electrode. One conventional approach to preventing contact-to-gate shorts is by controlling registration and critical dimensions (CDs). Unfortunately, for transistors with small gate pitches, severe CD control for gate and contact dimensions limit a manufacturable process window. Thus, the likelihood of a contact shorting to a gate is very high. This problem becomes more prevalent as transistor gate pitch dimensions are scaled down further because the critical dimensions become much smaller.

Self-aligned patterning needs to replace overlay-driven patterning so that cost-effective scaling can continue even after UN introduction. Selective deposition of thin films is a key step in patterning highly scaled technology nodes.

SUMMARY OF THE INVENTION

A method for forming a self-aligned contact using selective SiO$_2$ deposition is described in various embodiments. According to one embodiment, the method includes providing a planarized substrate containing a dielectric layer surface and a metal-containing surface, coating the dielectric layer surface with a metal-containing catalyst layer, and exposing the planarized substrate to a process gas containing a silanol gas for a time period that selectively deposits a SiO$_2$ layer on the metal-containing catalyst layer on the dielectric layer surface.

According to one embodiment, the method further includes depositing an etch stop layer on the SiO$_2$ layer and on the metal-containing surface, depositing an interlayer dielectric layer on the planarized substrate, etching a recessed feature in the interlayer dielectric layer and stopping on the etch stop layer above the metal-containing surface, and filling the recessed feature with a metal.

According to one embodiment, the method includes providing a planarized substrate containing a dielectric layer surface and a metal-containing surface, coating the dielectric layer surface with a first metal-containing catalyst layer, and exposing the planarized substrate to a process gas containing a silanol gas for a time period that deposits a SiO$_2$ layer on the dielectric layer surfaces and a thinner additional SiO$_2$ layer on the metal-containing surface, where the exposing is performed in the absence of any oxidizing and hydrolyzing agent at a substrate temperature of approximately 150° C., or less. The method further includes removing the additional SiO$_2$ layer from the metal-containing surface in an etching process, and repeating the coating, exposing and removing steps at least once in order to increase a thickness of the SiO$_2$ layer on the dielectric layer surface.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

One problematic issue caused by gate pitch scaling is the probability of contact-to-gate shorts. When such contact occurs, a short is created that effectively ruins the MOS transistor. Current methods to reduce the short include controlling registration and patterning contacts with smaller critical dimensions. However, as gate pitch has scaled down, the registration requirements are becoming very difficult to meet with existing technology.

According to one embodiment, a method is described for reducing the probability of contact-to-gate shorts during the fabrication a MOS transistor. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

FIGS. 1A-1F schematically show through cross-sectional views a method of processing a substrate according to an embodiment of the invention. The exemplary planarized substrate 100 shown in FIG. 1A contains various material layers commonly found in semiconductor devices, however, embodiments of the invention may be applied to simpler or more advanced semiconductor devices. The planarized substrate 100 contains an oxide layer 102 (e.g., $SiO_2$), a nitride layer 104 (e.g., SiN), a gate contact layer 106, a cap layer 108 (e.g., SiN or SiCN), a source/drain layer 112 (e.g., Si or SiC), a dielectric layer 110 (e.g., $SiO_2$) having an exposed dielectric layer surface 120, a metal-containing layer 114 (e.g., a trench silicide layer: $CoSi_2$, NiSi, or $MoSi_2$) having an exposed metal-containing surface 124. In the exemplary planarized substrate 100, the metal-containing layer 114 may be part of contact regions and gate regions that are prone to contact-to-gate shorts during further processing. The planarized substrate 100 may be prepared using a chemical mechanical polishing (CMP) process.

Figure 1A:
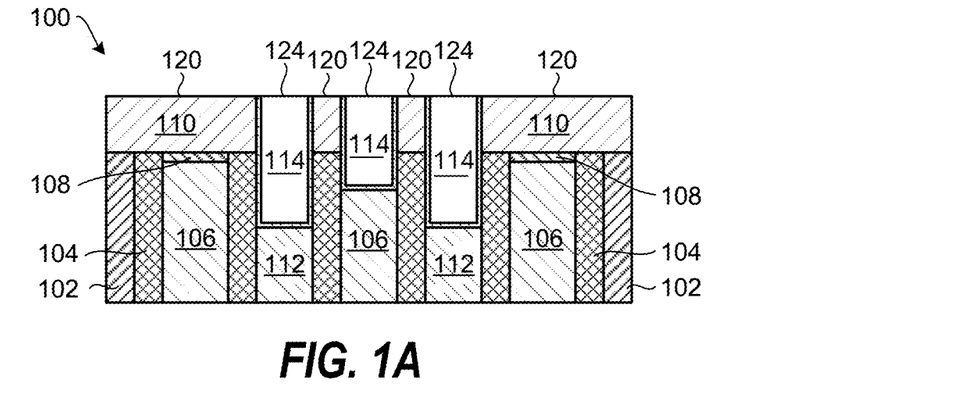
FIGS. 1A-1F schematically show through cross-sectional views a method of processing a substrate according to an embodiment of the invention.
Figure 1B:
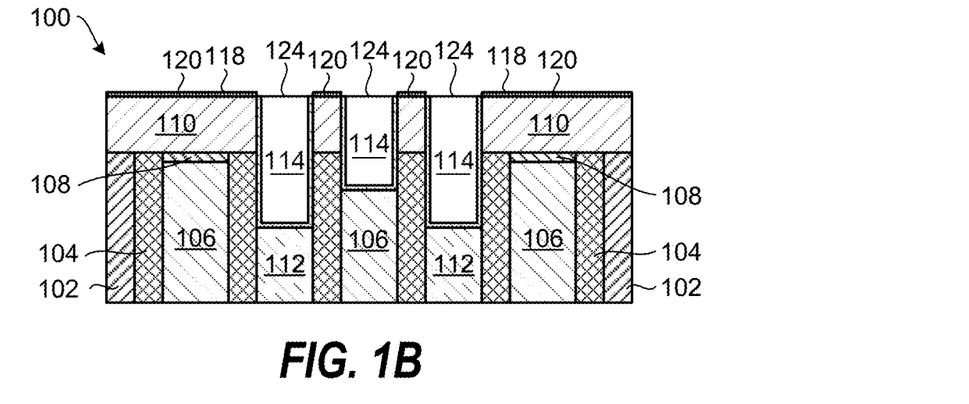

FIG. 1B shows the planarized substrate 100 following coating of the dielectric layer surface 120 with a metal-containing catalyst layer 118. The dielectric layer surface 120 may be terminated with hydroxyl groups (—OH) that provide good coating selectivity on the dielectric layer surface 120 compared to on the metal-containing surface 124. In accordance with some embodiments of the invention, the metal-containing catalyst layer 118 may comprise aluminum (Al), titanium (Ti), or both aluminum and titanium. According to one embodiment, the metal-containing catalyst layer 118 may be selected from the group consisting of Al, $Al_2O_3$, AlN, AlON, an Al-containing precursor, an Al-containing alloy, CuAl, TiAlN, TaAlN, Ti, TiAlC, $TiO_2$, TiON, TiN, a Ti-containing precursor, a Ti-containing alloy, and combinations thereof. The metal-containing catalyst layer 118 may be formed by exposing the planarized substrate 100 to a metal-containing precursor vapor and optionally an oxygen-containing gas and/or a nitrogen-containing gas. According to one embodiment, the exposing may proceed by exposing the planarized substrate 100 to a gas pulse containing a metal that preferentially adsorbs a metal-containing catalyst layer 118 that is approximately one monolayer thick on the dielectric layer surfaces 120. The metal may react on the surface of the planarized substrate 100 to form a chemisorbed layer that is less than a monolayer thick. In one example, the metal-containing catalyst layer 118 may include an adsorbed metal-containing precursor, e.g., trimethyl aluminum (TMA, $AlMe_3$).

Embodiments of the invention may utilize a wide variety of Al-containing precursors. For example, many aluminum precursors have the formula:

$AlL^1L^2L^3D_x$ where $L^1$, $L^2$, $L^3$, are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(O/Pr)_3$, $[Al(NMe_1)_3]_2$, $Al(iBu)_2Cl$, $Al(iBu)_3$, $Al(iBu)_2H$, $AlEt_2Cl$, $Et_3Al_2(OsBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), and $Ti(NMe_2)_4$ (TDMAT). Other examples include Ti-containing precursors containing "Ti—C" intra-molecular bonds include $Ti(COCH_3)(\eta^5\text{-}C_5H_5)_2Cl$, $Ti(\eta^5\text{-}C_5H_5)Cl_2$, $Ti(\eta^5\text{-}C_5H_5)Cl_3$, $Ti(\eta^5\text{-}C_5H_5)_2Cl_2$, $Ti(\eta^5\text{-}C_5(CH_3)_5)Cl_3$, $Ti(CH_3)(\eta^5\text{-}C_5H_5)_2Cl$, $Ti(\eta^5\text{-}C_9H_7)_2Cl_2$, $Ti((\eta^5\text{-}C_5(CH_3)_5)_2Cl$, $Ti((\eta^5\text{-}C_5(CH_3)_5)_2Cl_2$, $Ti(\eta^5\text{-}C_5H_5)_2(\mu\text{-}Cl)_2$, $Ti(\eta^5\text{-}C_5H_5)_2(CO)_2$, $Ti(CH_3)_3(\eta^5\text{-}C_5H_5)$, $Ti(CH_3)_2((\eta^5\text{-}C_5H_5)_2$, $Ti(CH_3)_4$, $Ti(\eta^5\text{-}C_5H_5)(\eta^7\text{-}C_7H_7)$, $Ti(\eta^5\text{-}C_5H_5)((\eta^8\text{-}C_8H_8)$, $Ti(C_5H_5)_2(\eta^5\text{-}C_5H_5)_2$, $Ti((C_5H_5)_2)_2(\eta\text{-}H)_2$, $Ti(\eta^5\text{-}C_5(CH_3)_5)_2$, $Ti(\eta^5\text{-}C_5(CH_3)_5)_2(H)_2$, and $Ti(CH_3)_2(\eta^5\text{-}C_5(CH_3)_5)_2$, $TiCl_4$ is an example of a titanium halide precursor containing a "Ti-halogen" bond.

Figure 1C:
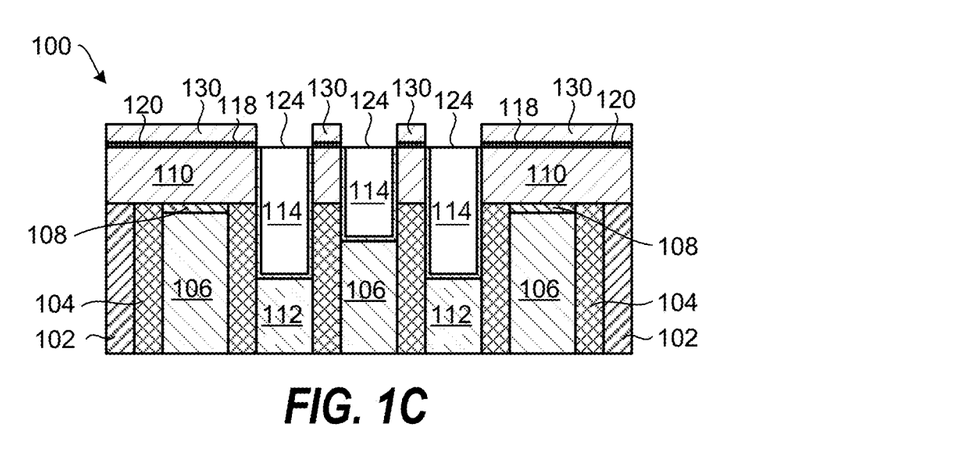

Referring now to FIG. 1C, a $SiO_2$ film 130 is selectively deposited on the metal-containing catalyst layer 118 relative to the metal-containing surface 124 by exposing the planarized substrate 100 to a process gas containing a silanol gas. According to embodiments of the invention, the metal-containing catalyst layer 118 catalyzes the selective deposition of a $SiO_2$ film 130 from the silanol gas, and this catalytic effect is observed until the deposited $SiO_2$ film 130 is about 5 nm thick. The exposure to the process gas may be carried out for a time period that does not result in significant $SiO_2$ deposition on the metal-containing surfaces 124. According to embodiments of the invention, the planarized substrate 100 is exposed to the process gas containing a silanol gas in the absence of any oxidizing and hydrolyzing agent. According to some embodiments, the silanol gas may be selected from the group consisting of tris(tert-pentoxy) silanol (TPSOL), tris(tert-butoxy)silanol, and bis(tert-butoxy)(isopropoxy)silanol.

The inventors have discovered that oxidizing and hydrolyzing agents are not required for the $SiO_2$ film deposition. In some examples, the process gas may further contain an inert gas such as Argon. In one embodiment, the process gas may consist of a silanol gas and an inert gas. Furthermore, according to one embodiment, the substrate temperature may be approximately 150° C., or less, during the exposing. In another embodiment, the substrate temperature may be approximately 120° C., or less. In yet another embodiment, the substrate temperature may be approximately 100° C., or less.

Figure 1D:
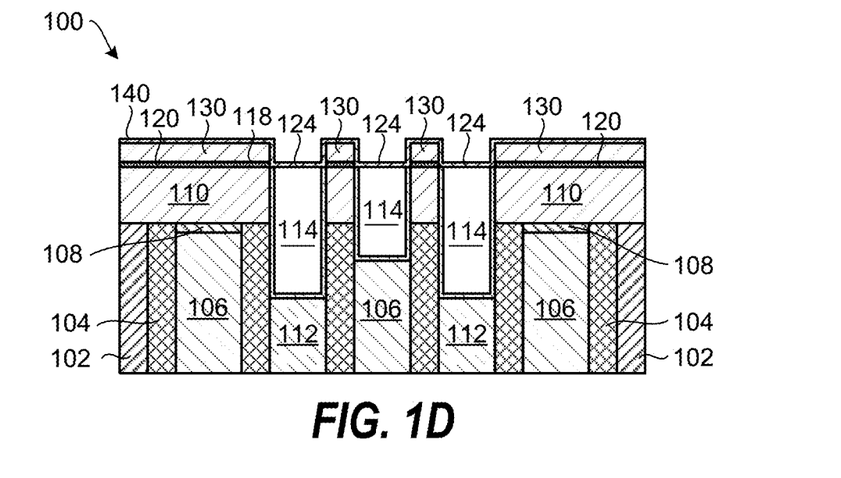

FIG. 1D shows the planarized substrate 100 following deposition of an etch stop layer 140 on the $SiO_2$ film 130 and on the metal-containing surfaces 124. The etch stop layer 140 can, for example, include $Al_2O_3$.

Figure 1E:
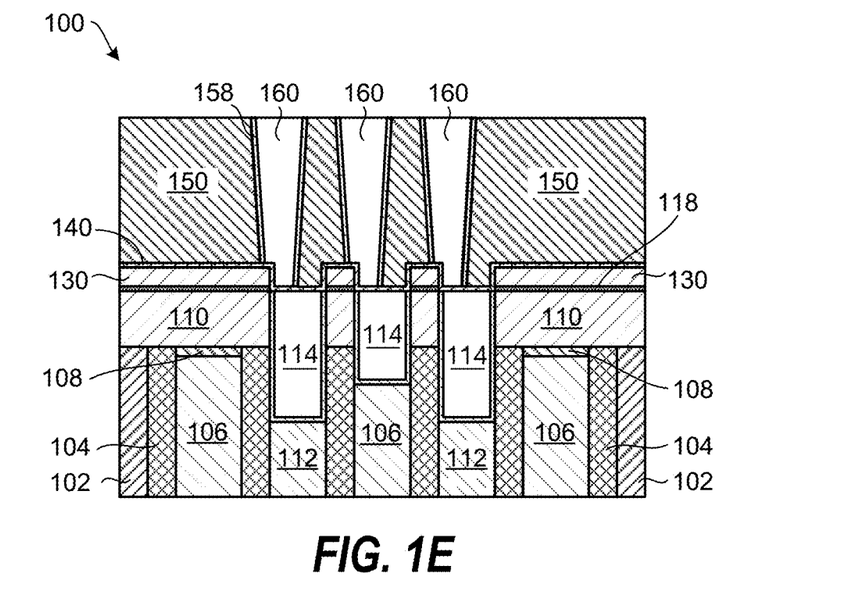

Further processing of the planarized substrate 100 can include deposition of an interlayer dielectric layer (IDL) 150, etching features in the IDL 150 and stopping on the etch stop layer 140. Thereafter, a barrier layer 158 is deposited in the features and the features filled with a metal. The metal filled features 160 can, in one example, include tungsten (W), ruthenium (Ru), copper (Cu), or cobalt (Co). As schematically shown in FIG. 1E, the metal filled features 160 may not line up with the underlying metal-containing layer 114 and the gate oxide layer 116. This can be due to intentional misalignment to increase the spacing between each of the metal filled features 160, or unintentional misalignment due to overlay errors. The inventors have realized that the selectively deposited $SiO_2$ film 130 above the dielectric layer 110 greatly reduces the probability of shorting out the metal-containing layer 114 and the gate oxide layer 116 by the metal filled features 160.

Figure 1F:
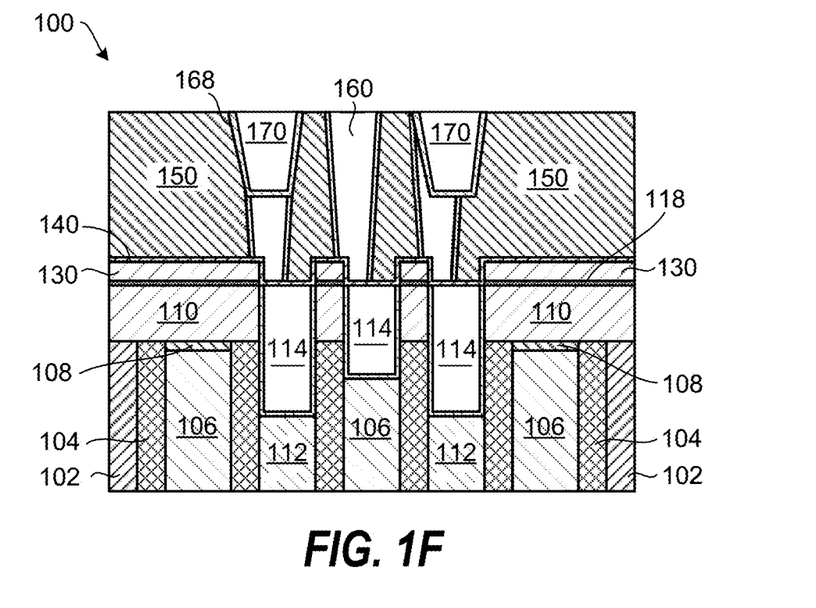

FIG. 1F shows further processing of the planarized substrate 100, including etching of holes in the metal filled features 160, and deposition of a barrier layer 168 and metal film 170 in the holes. In one example, the metal film 170 can include copper (Cu).

Figure 2A:
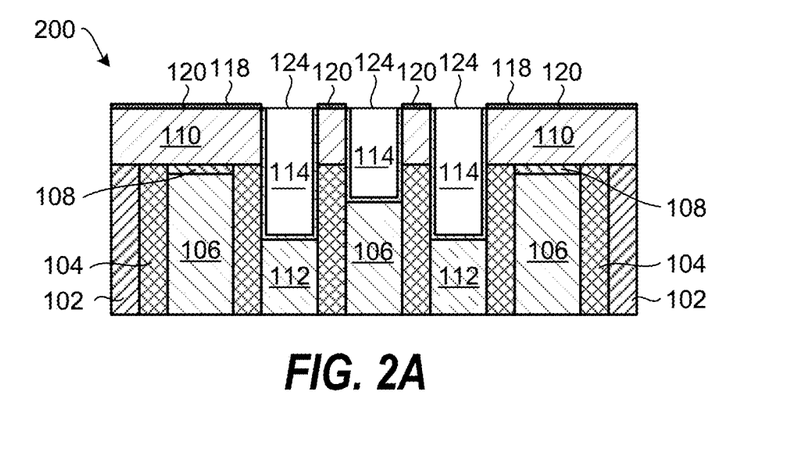
FIGS. 2A-2F schematically show through cross-sectional views a method of processing a substrate according to an embodiment of the invention.

FIGS. 2A-2F schematically show through cross-sectional views a method of processing a substrate according to an embodiment of the invention. The planarized substrate 100 in FIG. 1B has been reproduced as a planarized substrate 200 in FIG. 2A. FIG. 2A shows a planarized substrate 200 following coating of the dielectric layer surface 120 with a metal-containing catalyst layer 118. The dielectric layer surface 120 may be terminated with hydroxyl groups (—OH) that provide good coating selectivity on the dielectric layer surface 120 compared to the metal-containing surface 124.

Figure 2B:
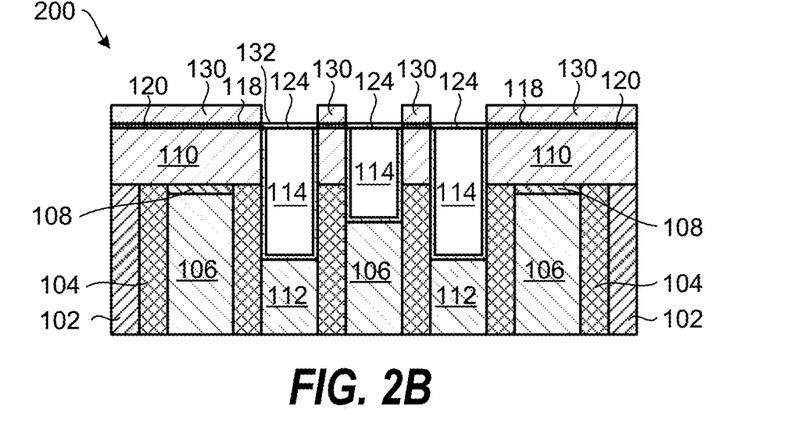

Referring now to FIG. 2B, a $SiO_2$ film 130 is deposited on the metal-containing catalyst layer 118 and a thinner $SiO_2$ film 132 is deposited on the metal-containing surfaces 124 by exposing the planarized substrate 200 to a process gas containing a silanol gas. The exposure to the process gas may be longer than the selective deposition in FIG. 1C, resulting in loss of selectivity and deposition of the thinner $SiO_2$ film 132 on the metal-containing surfaces 124.

Figure 2C:
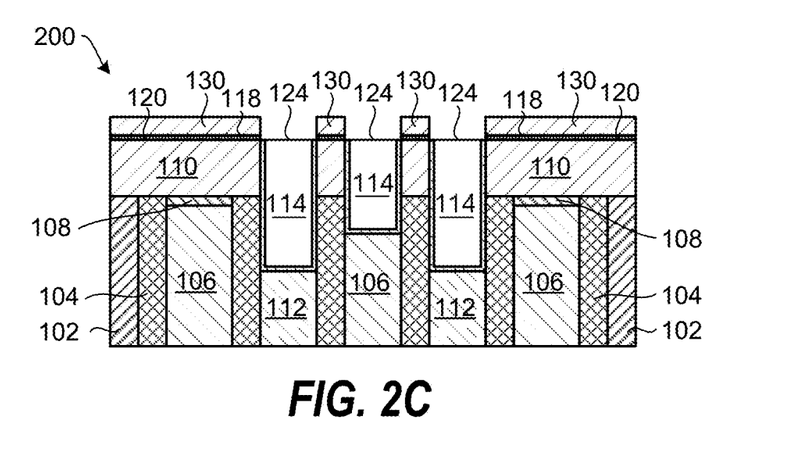

The unwanted $SiO_2$ film 132 on the metal-containing surfaces 124 may be removed in an etching process, for example using a chemical oxide removal (COR) process or using a dilute hydrogen fluoride (DHF) solution. Some thinning of the $SiO_2$ film 130 may occur during the removal of the $SiO_2$ film 132. The resulting planarized substrate 200 is shown in FIG. 2C.

Figure 2D:
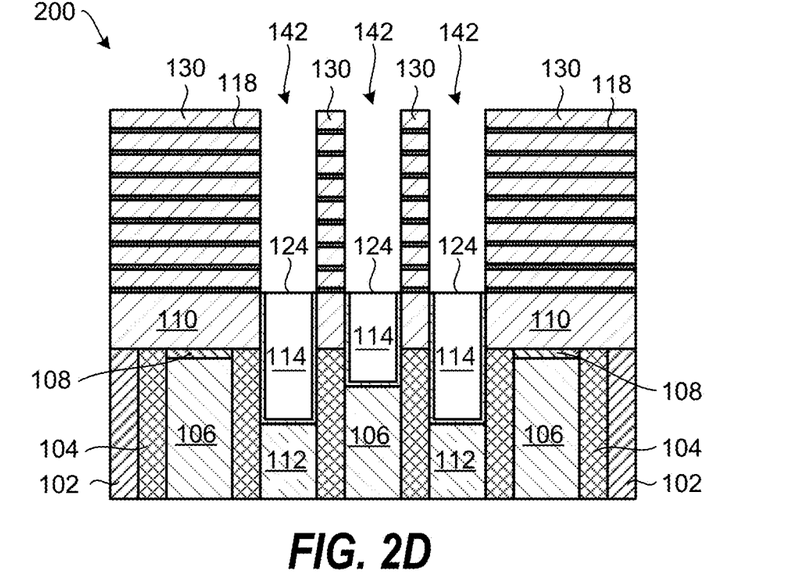

The coating of the dielectric layer surface 120 with the metal-containing catalyst layer 118, the $SiO_2$ deposition process using an exposure to a process gas containing a silanol gas, and the etching process may be repeated at least once to increase the thickness of the $SiO_2$ film 130. FIG. 2D shows the planarized substrate 200 after repeating the processes 7 times and forming self-aligned recessed features 142 in the $SiO_2$ film 130.

Figure 2E:
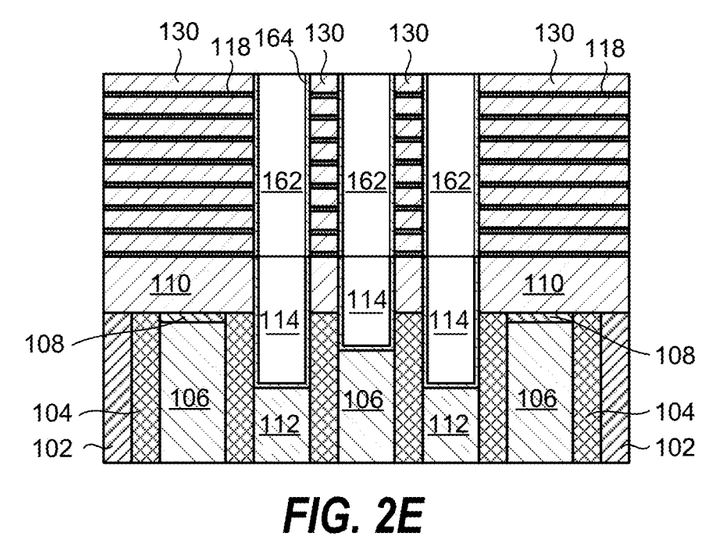

Further processing of the planarized substrate 200 is shown in FIG. 2E and includes depositing a barrier layer 164 in the recessed features 142, and filling the recessed features HO 142 with a metal 162. The metal 162 can, for example, contain tungsten (W), cobalt (Co), ruthenium (Ru), or aluminum (Al).

Figure 2F:
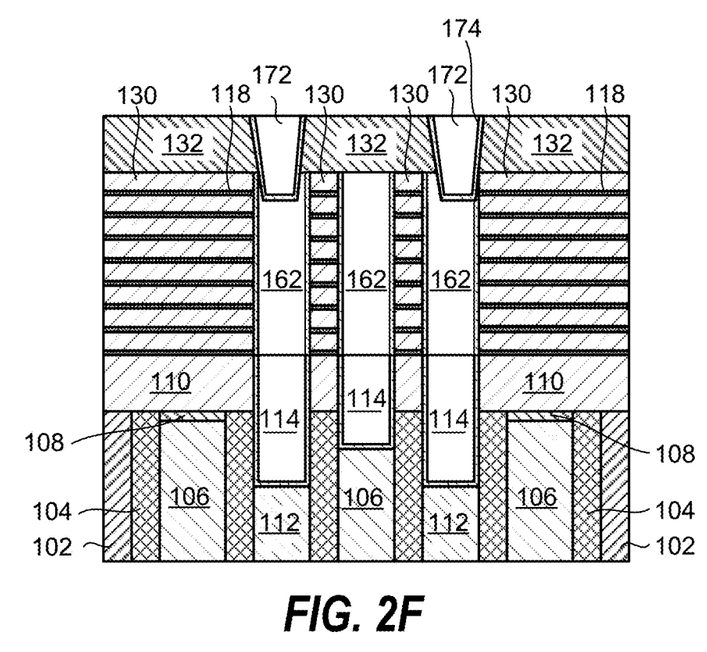

FIG. 2F shows further processing of the planarized substrate 200, including etching of holes in the metal 162 and deposition of a barrier layer 174 and metal film 172 in the holes. The metal film 172 can, for example, contain tungsten (W), cobalt (Co), ruthenium (Ru), or aluminum (Al).

Figure 3:
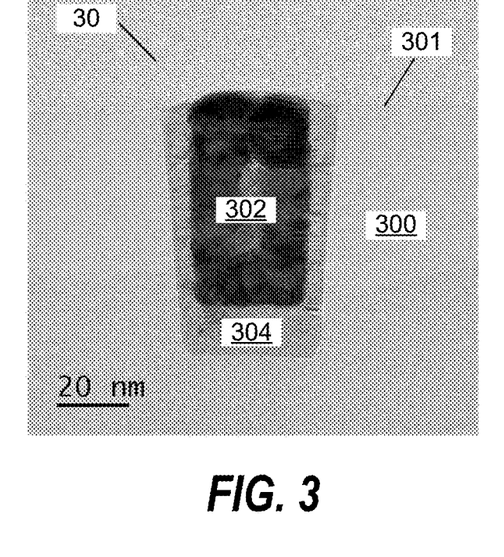
FIG. 3 shows a cross-sectional transmission electron microscope (TEM) image of a SiO$_2$ film selectively deposited on a substrate according to an embodiment of the invention.

FIG. 3 shows a cross-sectional TEM image of a planarized substrate 30. A $SiO_2$ film 301 was selectively deposited on a $SiO_2$ layer 300 relative to a TaN barrier layer 304 and a W metal plug 302. No $SiO_2$ deposition was observed on the W metal plug 302. The $SiO_2$ deposition was performed using a 6 sec exposure of TMA followed by a 60 sec exposure of TPSOL.

Figure 4:
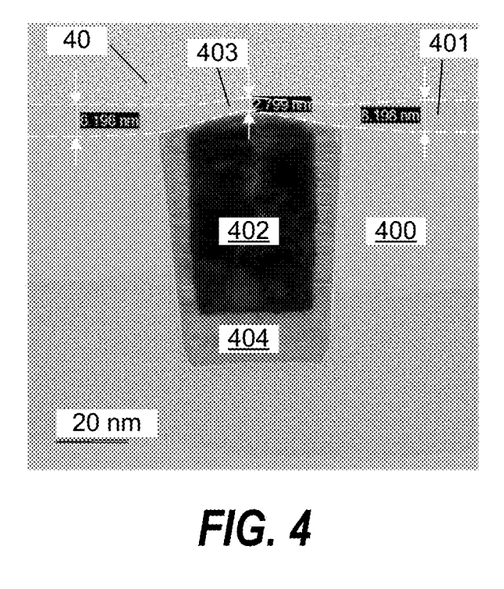
FIG. 4 shows a cross-sectional TEM image of a SiO$_2$ film deposited on a substrate according to an embodiment of the invention.

FIG. 4 shows a cross-sectional TEM image of a planarized substrate 40. A $SiO_2$ film 401 was deposited on a $SiO_2$ layer 400 and a thinner $SiO_2$ film 403 was deposited on TaN barrier layer 404 and W metal plug 402. The $SiO_2$ film 401 has a thickness of about 8.2 nm and the $SiO_2$ film 403 has a thickness of about 2.8 nm on the W metal plug 402. The $SiO_2$ deposition was performed using 6 deposition cycles where each cycle included a 6 sec exposure of TMA followed by a 60 sec exposure of TPSOL.

A plurality of embodiments for substrate processing methods for forming a self-aligned contact using selective $SiO_2$ deposition have been described. While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:
1. A substrate processing method, comprising:
providing a planarized substrate containing a dielectric layer surface and a metal-containing surface;
coating the dielectric layer surface with a metal-containing catalyst layer; and
exposing the planarized substrate to a process gas containing a silanol gas for a time period that selectively deposits a $SiO_2$ layer on the metal-containing catalyst layer on the dielectric layer surface, wherein the exposing the planarized substrate to the process gas containing the silanol gas is performed in the absence of any oxidizing and hydrolyzing agent at a substrate temperature of approximately 150° C., or less.
2. The method of claim 1, wherein the $SiO_2$ layer forms a raised $SiO_2$ feature adjacent to the metal-containing surface.
3. The method of claim 1, wherein the silanol gas is selected from the group consisting of tris(tert-pentoxy) silanol, tris(tert-butoxy) silanol, and bis(tert-butoxy)(isopropoxy) silanol.
4. The method of claim 1, wherein the substrate temperature is approximately 150° C., or less, during the exposing.
5. The method of claim 1, wherein the substrate temperature is approximately 100° C., or less, during the exposing.
6. The method of claim 1, wherein the process gas consists of a silanol gas and an inert gas.
7. The method of claim 1, wherein the $SiO_2$ layer is deposited on the metal-containing catalyst layer in a self-limiting process.
8. The method of claim 7, wherein a thickness of the $SiO_2$ layer is about 5 nm.
9. The method of claim 1, wherein the exposing further includes
exposing the planarized substrate to the process gas containing the silanol gas for an additional time period that deposits a thinner additional $SiO_2$ layer on the metal-containing surface; and
removing the additional $SiO_2$ layer from the metal-containing surface in an etching process.
10. The method of claim 9, further comprising, repeating the coating, exposing and removing steps at least once in order to increase a thickness of the $SiO_2$ layer on the dielectric layer surface.
11. The method of claim 1, further comprising:
depositing an etch stop layer on the $SiO_2$ layer and on the metal-containing surface.
12. The method of claim 11, further comprising
depositing an interlayer dielectric layer on the planarized substrate;

etching a recessed feature in the interlayer dielectric layer and stopping on the etch stop layer above the metal-containing surface; and filling the recessed feature with a metal.

13. The method of claim 11, wherein the etch stop layer includes $Al_2O_3$.

14. A substrate processing method, comprising:
providing a planarized substrate containing a dielectric layer surface and a metal-containing surface;
coating the dielectric layer surface with a metal-containing catalyst layer;
exposing the planarized substrate to a process gas containing a silanol gas for a time period that selectively deposits a $SiO_2$ layer on the dielectric layer surface relative to the metal-containing surface, wherein the exposing is performed in the absence of any oxidizing and hydrolyzing agent at a substrate temperature of approximately 150° C., or less;
depositing an etch stop layer on the $SiO_2$ layer and on the metal-containing surface;
depositing an interlayer dielectric layer on the planarized substrate;
etching a recessed feature in the interlayer dielectric layer and stopping on the etch stop layer above the metal-containing surface; and
filling the recessed feature with a metal.

15. The method of claim 14, wherein the etch stop layer includes $Al_2O_3$.

16. The method of claim 14, wherein the $SiO_2$ layer forms a raised $SiO_2$ feature adjacent to the metal-containing surface.

17. A substrate processing method, comprising:
providing a planarized substrate containing a dielectric layer surface and a metal-containing surface;
coating the dielectric layer surface with a first metal-containing catalyst layer;
exposing the planarized substrate to a process gas containing a silanol gas for a time period that deposits a $SiO_2$ layer on the dielectric layer surfaces and a thinner additional $SiO_2$ layer on the metal-containing surface, wherein the exposing is performed in the absence of any oxidizing and hydrolyzing agent at a substrate temperature of approximately 150° C., or less;
removing the additional $SiO_2$ layer from the metal-containing surface in an etching process; and
repeating the coating, exposing and removing steps at least once in order to increase a thickness of the $SiO_2$ layer on the dielectric layer surface.

18. The method of claim 17, wherein the etch stop layer includes $Al_2O_3$.

19. The method of claim 17, wherein the $SiO_2$ layer forms a raised $SiO_2$ feature adjacent the metal-containing surface.

* * * * *